(12) United States Patent
Zhang (10) Patent No.: US 9,882,063 B2
(45) Date of Patent: Jan. 30, 2018

(54) THIN FILM TRANSISTOR AND MANUFACTURING METHOD THEREOF, ARRAY SUBSTRATE AND DISPLAY DEVICE

(71) Applicant: BOE TECHNOLOGY GROUP CO., LTD., Beijing (CN)

(72) Inventor: Li Zhang, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 54 days.

(21) Appl. No.: 14/914,228

(22) PCT Filed: Aug. 10, 2015

(86) PCT No.: PCT/CN2015/086443
§ 371 (c)(1),
(2) Date: Feb. 24, 2016

(87) PCT Pub. No.: WO2016/145769
PCT Pub. Date: Sep. 22, 2016

(65) Prior Publication Data
US 2017/0040466 A1    Feb. 9, 2017

(30) Foreign Application Priority Data

Mar. 18, 2015   (CN) .......................... 2015 1 0121068

(51) Int. Cl.
*H01L 29/786*    (2006.01)
*H01L 29/40*    (2006.01)
(Continued)

(52) U.S. Cl.
CPC ...... *H01L 29/78696* (2013.01); *H01L 29/401* (2013.01); *H01L 29/41733* (2013.01); *H01L 29/42384* (2013.01); *H01L 29/786* (2013.01)

(58) Field of Classification Search
CPC ............. H01L 29/78696; H01L 29/401; H01L 29/41733; H01L 29/42384; H01L 29/786; H01L 29/78618
See application file for complete search history.

(56) References Cited

U.S. PATENT DOCUMENTS 5,100,816 A  *  3/1992  Rodder ............. H01L 29/78624
                                                    257/382
7,864,257 B2 *  1/2011  Huh .................. H01L 29/41733
                                                    257/59
(Continued)

FOREIGN PATENT DOCUMENTS

CN          101154677 A      4/2008
CN          102054833 A      5/2011
(Continued)

OTHER PUBLICATIONS

International Search Report and Written Opinion for Application No. PCT/CN2015/086443, dated Nov. 30, 2015, 12 Pages.
(Continued)

*Primary Examiner* — Earl Taylor
(74) *Attorney, Agent, or Firm* — Brooks Kushman P.C.

(57) ABSTRACT

The present disclosure relates to the field of manufacturing technologies for semiconductor devices and provides a thin film transistor and a manufacturing method thereof, an array substrate and a display device. The thin film transistor includes: an active layer located on a plane; a source electrode, which is located on the active layer and is in contact with the active layer; a first insulation layer located on the source electrode and including a first via hole; and a drain electrode located on the first insulation layer, where the drain electrode is in contact with the active layer via the first via hole.

13 Claims, 4 Drawing Sheets

(51) Int. Cl.
*H01L 29/417* (2006.01)
*H01L 29/423* (2006.01)

(56) References Cited

U.S. PATENT DOCUMENTS

| | | | | |
|---|---|---|---|---|
| 8,574,958 | B2* | 11/2013 | Wang | H01L 29/7391 257/E45.003 |
| 9,024,323 | B2* | 5/2015 | Oh | H01L 29/66757 257/71 |
| 9,123,587 | B2* | 9/2015 | Tsai | H01L 27/3258 |
| 9,601,584 | B2* | 3/2017 | Tsai | H01L 27/3258 |
| 9,685,460 | B2* | 6/2017 | Choi | H01L 27/1225 |
| 2004/0125262 | A1* | 7/2004 | Cho | G02F 1/1368 349/43 |
| 2004/0233361 | A1* | 11/2004 | Ha | G02F 1/133555 349/114 |
| 2005/0110028 | A1* | 5/2005 | Park | H01L 27/3246 257/88 |
| 2009/0250695 | A1* | 10/2009 | Tanaka | H01L 27/1225 257/43 |
| 2010/0059751 | A1* | 3/2010 | Takahashi | H01L 29/7869 257/57 |
| 2010/0171120 | A1* | 7/2010 | Gosain | G02F 1/1368 257/59 |
| 2010/0276685 | A1* | 11/2010 | Itagaki | H01L 29/7869 257/43 |
| 2012/0262642 | A1 | 10/2012 | Ikeda et al. | |
| 2013/0140548 | A1* | 6/2013 | Kohiro | H01L 51/0071 257/40 |
| 2013/0178012 | A1* | 7/2013 | Wang | H01L 29/267 438/104 |
| 2013/0200399 | A1* | 8/2013 | Jin | H01L 27/3276 257/88 |
| 2013/0256676 | A1* | 10/2013 | Jin | H01L 27/3262 257/72 |
| 2014/0062859 | A1* | 3/2014 | Lee | G06F 3/01 345/156 |
| 2014/0103332 | A1* | 4/2014 | Ahn | H01L 29/78696 257/43 |
| 2014/0139774 | A1* | 5/2014 | Tsai | H01L 27/3258 349/43 |
| 2015/0034943 | A1* | 2/2015 | Yu | H01L 27/1225 257/43 |
| 2015/0179809 | A1* | 6/2015 | Liu | H01L 29/78606 257/72 |
| 2016/0071834 | A1* | 3/2016 | Zhang | H01L 27/1214 257/72 |
| 2016/0247830 | A1* | 8/2016 | Zhang | H01L 27/1225 |
| 2016/0276376 | A1* | 9/2016 | Sun | H01L 27/124 |
| 2017/0040466 | A1* | 2/2017 | Zhang | H01L 29/401 |

FOREIGN PATENT DOCUMENTS

| | | |
|---|---|---|
| CN | 102082179 A | 6/2011 |
| CN | 103219389 A | 7/2013 |
| CN | 104269379 A | 1/2015 |
| CN | 104716196 A | 6/2015 |
| JP | 4935963 B2 | 5/2012 |
| KR | 1020050050494 A | 5/2005 |
| WO | WO 2014166168 A1 * 10/2014 | H01L 29/41733 |

OTHER PUBLICATIONS

Korean Office Action for Application No. KR 10-2016-7031863, dated Oct. 19, 2017, 5 Pages.

* cited by examiner

THIN FILM TRANSISTOR AND MANUFACTURING METHOD THEREOF, ARRAY SUBSTRATE AND DISPLAY DEVICE

CROSS-REFERENCE TO RELATED APPLICATION

This application is the U.S. national phase of PCT Application No.PCT/CN2015/086443 filed on Aug. 10, 2015, which claims a priority of the Chinese Patent Application No. 201510121068.X filed on Mar. 18, 2015, the disclosures of which are incorporated in their entirety by reference herein.

TECHNICAL HELD

The present disclosure relates to the field of manufacturing technologies for semiconductor devices, in particular, to a thin film transistor and a manufacturing method thereof, an array substrate and a display device.

BACKGROUND

Thin film transistor liquid crystal display (TFT-LCD), which has advantages such as small size, low power consumption, free of radiation and relatively low manufacturing cost, takes a dominant role in the current panel display market.

Figure 1:
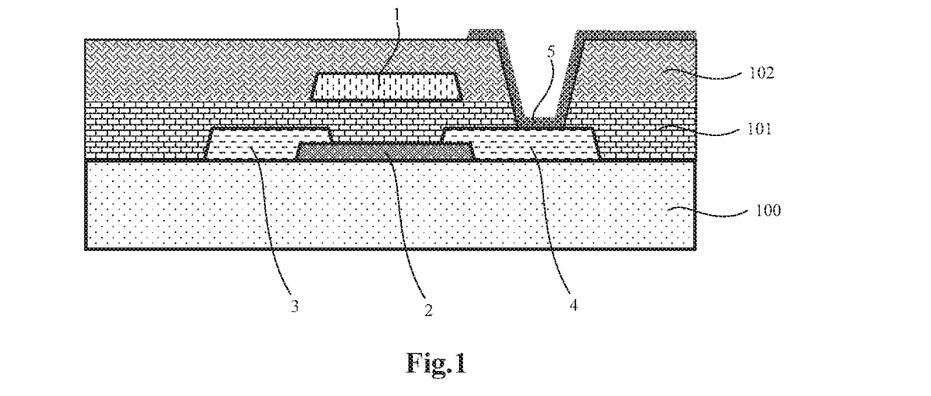
FIG. 1 is a schematic structural diagram of an existing top-gate co-planar thin film transistor array substrate.
Figure 2:
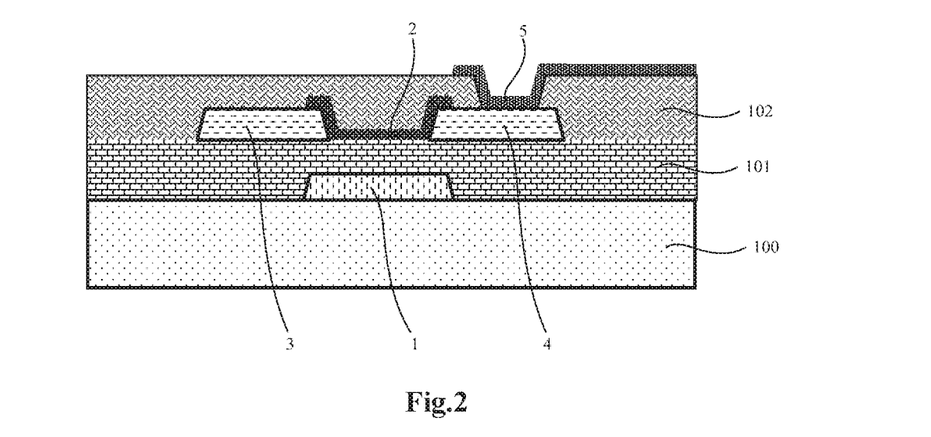
FIG. 2 is a schematic structural diagram of an existing bottom-gate co-planar thin film transistor array substrate.

As shown in FIG. 1 and FIG. 2, in a co-planar thin film transistor (TFT), a source electrode 3, a drain electrode 4 and a gate electrode 1 are arranged at a same side of an active layer 2. According to a position of the gate electrode 1 with respect to the active layer 2, co-planar TFTs can be classified into top-gate co-planar TFT (as shown in FIG. 1) and bottom-gate co-planar TFT (as shown in FIG. 2).

When applying the co-planar TFT into the TFT-LCD, as shown in FIG. 1, for the top-gate co-planar TFT, a pixel electrode 5 is in electrical contact with the drain electrode 4 via a via hole penetrating a passivation layer 102 and a gate insulation layer 101. The via hole has a large depth, so it is difficult for the pixel electrode 5 to climb and the pixel electrode 5 may be prone to be broken, resulting in poor electrical contact. If the electrical connection between the pixel electrode 5 and the drain electrode 4 is realized through jumping connection, a quantity of masks is increased and the production cost is increased. For the bottom-gate co-planar TFT, as shown in FIG. 2, the active layer 2 is provided on the source electrode 3 and the drain electrode 4 through a lap joint. Since lateral surfaces of a source metal and a drain metal are rough due to etching process when forming the source electrode 3 and the drain electrode 4, and the active layer 2 is thin, the climbing problems and breakages may occur in the active layer 2. In addition, in the above case, the active layer 2 has an uneven thickness and the short circuit is prone to be generated.

SUMMARY

A thin film transistor and a manufacturing method thereof are provided in the present disclosure, so as to solve the above described problems of the co-planar thin film transistor and its applications.

The present disclosure further provides an array substrate and a display device including the foregoing thin film transistor, to improve the yield of the device.

To solve the technical problems above, a thin film transistor is provided according to an embodiment of the present disclosure, including:
an active layer located on a plane;
a source electrode, which is located on the active layer and is in contact with the active layer;
a first insulation layer located on the source electrode and including a first via hole; and.
a drain electrode located on the first insulation layer, where the drain electrode is in contact with the active layer via the first via hole.

A manufacturing method for a thin film transistor is further provided according to an embodiment of the present disclosure, including:
forming an active layer, where the entire active layer is located on a plane;
forming a source electrode on the active layer, the source electrode being in contact with the active layer;
forming a first insulation layer on the source electrode and forming a first via hole in the first insulation layer; and
forming a drain electrode on the first insulation layer, where the drain electrode is in contact with the active layer via the first via hole.

An array substrate is further provided according to an embodiment of the present disclosure, including:
the foregoing thin film transistor;
a second insulation layer covering the drain electrode of the thin film transistor; and
a pixel electrode located on the second insulation layer, where the second insulation layer includes a third via hole and the pixel electrode is in electrical contact with the drain electrode of the thin film transistor via the third via hole.

A display device is further provided according to an embodiment of the present disclosure, including the forgoing array substrate.

A manufacturing method for an array substrate is further provided according to an embodiment of the present disclosure, including:
forming an active layer, where the entire active layer is located on a plane;
forming a source electrode on the active layer, the source electrode being in contact with the active layer;
forming a first insulation layer on the source electrode and forming a first via hole in the first insulation layer;
forming a gate metallic layer on the first insulation layer, patterning the gate metallic layer to form a second portion of a gate electrode and a drain electrode, where the drain electrode is in contact with the active layer via the first via hole in the first insulation layer;
forming a second insulation layer covering the drain electrode and forming a second via hole and a third via hole in the second insulation layer;
forming a first portion of the gate electrode on the second insulation layer, where the first portion includes a part corresponding to a region between the source electrode and the drain electrode and the first portion of the gate electrode is in electrical contact with the second portion of the gate electrode via the second via hole in the second insulation layer; and
forming a pixel electrode of the array substrate while forming the first portion of the gate electrode, where the pixel electrode is in electrical contact with the drain electrode via the third via hole.

The technical solution of the present disclosure has the following beneficial effects. In the above technical solutions, the source electrode and the drain electrode of the thin film transistor are arranged on the active layer and the active layer is located on a plane. Accordingly, it is able to prevent the active layer from being broken due to the difficulty in climbing. In addition, the active layer has a uniform thickness so that the short circuit may be avoided, thereby improving the yield of the thin film transistor. Furthermore, the source electrode and the drain electrode are arranged at different layers and a distance between the source electrode and the drain electrode can be adjusted flexibly, thereby facilitating achievement of a narrow channel and improving performance of the thin film transistor.

BRIEF DESCRIPTION OF THE DRAWINGS

To clarify technical solutions according to embodiments of the present disclosure or conventional technologies, drawings to be used in descriptions for the embodiments or for the conventional technologies are briefly introduced hereinafter. Apparently, the following described drawings are merely for a part of the embodiments of the present disclosure; other drawings can be obtained by the ordinary skilled in the art based on the described drawings without paying inventive efforts.

DETAILED DESCRIPTION OF THE EMBODIMENTS

Unless other definitions are given, technical terms or scientific terms used herein refer to normal meanings which can be understood by the ordinary skilled in the field to which the present disclosure relates. Terms such as "first" and "second" used in the specification and the list of claims of the present disclosure do not indicate any order, numbers or importance, and are merely used to distinguish different components. Similarly, terms such as "a" or "an" represent there exist at least one, rather than to limit the number. Terms such as "connected with" or "connected to" do not limit to physical or mechanical connections, and can include electrical connections which re either direct or indirect. Terms such as "above/on", "below/under", "left" and "right" are merely used to describe a relative position relationship; if the absolute position of one described object alters, the relative position relationship with respect to the described object alters correspondingly.

The present disclosure provides a thin film transistor, of which a source electrode and a drain electrode are arranged on an active layer and the active layer is located on a plane. Accordingly, it is able to prevent the active layer from being broken due to the difficulty in climbing. In addition, the active layer has a uniform thickness and so that the short circuit may be avoided, thereby improving the yield of the thin film transistor. Furthermore, the source electrode and the drain electrode are arranged at different layers and a distance between the source electrode and the drain electrode can be adjusted flexibly, thereby facilitating achievement of a narrow channel and improving performance of the thin film transistor.

In a liquid crystal display device, an electrode, which is located on an array substrate and is in electrical contact with a drain electrode of a thin film transistor, is a transparent pixel electrode made of, for example, indium tin oxide (ITO) or indium zinc oxide (IZO). In an organic light emitting diode (OLED) display device, a bottom electrode, which is located on an array substrate and is in electrical contact with a drain electrode of a driving thin film transistor, is a cathode or an anode of an OLED. The bottom electrode may be made of a transparent conductive material, or may be made of an opaque conductive material (e.g., Cu, Al). In addition, the bottom electrode is usually called as a pixel electrode as used throughout the present disclosure).

Specific implementations of the present disclosure are further detailed hereinafter in conjunction with drawings and embodiments. The following embodiments intend to explain, rather than to limit the present disclosure.

Figure 3:
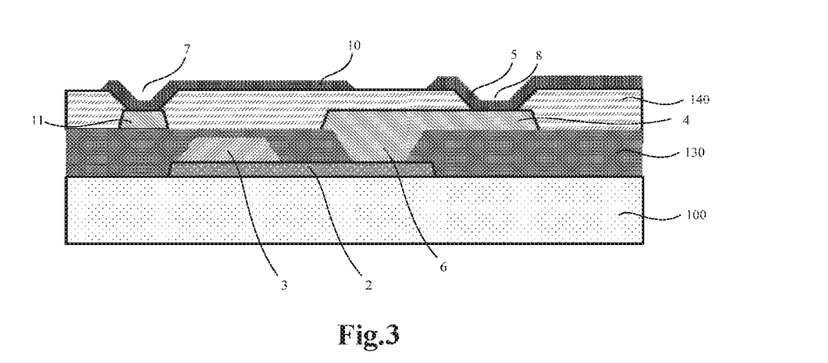
FIG. 3 is a schematic structural diagram of a co-planar thin film transistor array substrate according to an embodiment of the present disclosure.
Figure 8:
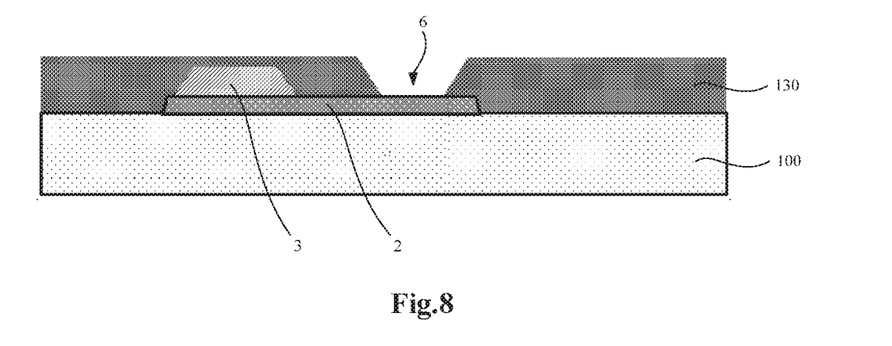

As shown in FIG. 3 and FIG. 8, a thin film transistor is provided according to an embodiment of the present disclosure, of which an entire active layer 2 is located on a plane. A source electrode 3 and a drain electrode 4 of the thin film transistor are located on the active layer 2 and are in contact with the active layer 2. A first insulation layer 130 is arranged between the source electrode 3 and the drain electrode 4. The drain electrode 4 is arranged on the first insulation layer 130 and is in contact with the active layer 2 via a first via hole 6 in the first insulation layer 130.

In the above described technical solution, the active layer 2 is located on a plane. Accordingly, it is able to prevent the active layer from being broken due to the difficulty in climbing. In addition, the active layer has a uniform thickness so that the short circuit may be avoided, thereby solving the technical problem of an existing bottom-gate co-planar thin film transistor. Furthermore, the source electrode 3 and the drain electrode 4 are located at different layers, thereby facilitating achievement of a narrow channel and improving performance of the thin film transistor.

As shown in FIG. 3, the present disclosure further provides in an embodiment a method for manufacturing a thin film transistor which includes:
  forming an active layer 2, where the active layer 2 is located on a plane;
  forming a source electrode 3 on the active layer 2, the source electrode 3 being in contact with the active layer 2;
  forming a first insulation layer 130 on the source electrode 3 and forming a first via hole 6 in the first insulation layer 130; and
  forming a drain electrode 4 on the first insulation layer 130, where the drain electrode 4 is in contact with the active layer 2 via the first via hole 6.

The source electrode 3 and the drain electrode 4 are located at different layers and are formed by different films.

As shown in FIG. 3, the source electrode 3 may be located in a region where the active layer 2 of the thin film transistor is located, and the entire source electrode 3 is in contact with the active layer 2. In practical manufacture, the source electrode 3 and the active layer 2 can be simultaneously formed through one pattering process, thereby simplifying the manufacturing processes.

Figure 4:
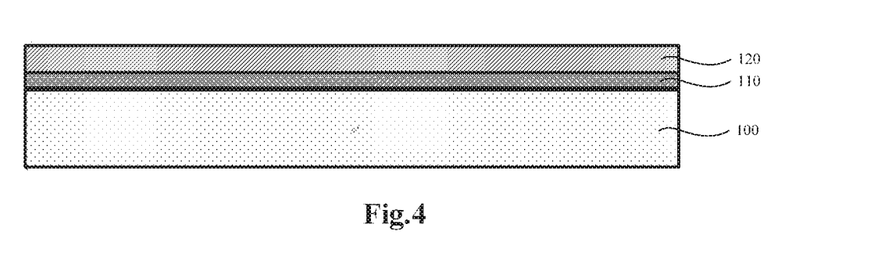
FIG. 4-FIG. 9 illustrate a manufacturing procedure of a co-planar thin film transistor array substrate according to an embodiment of the present disclosure.
Figure 5:
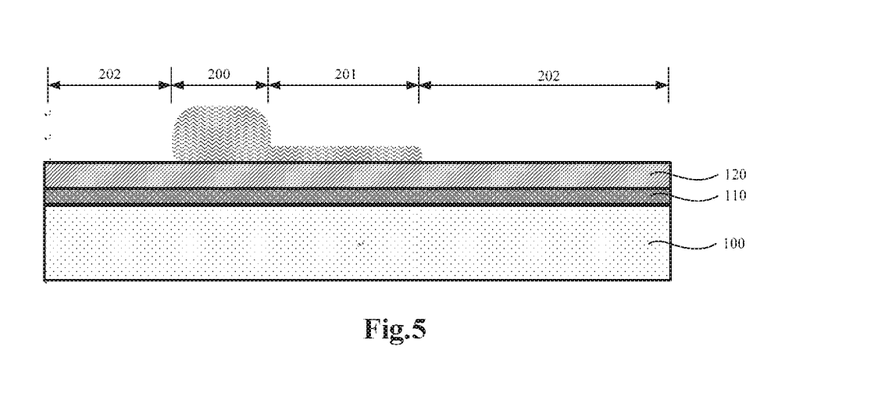
Figure 6:
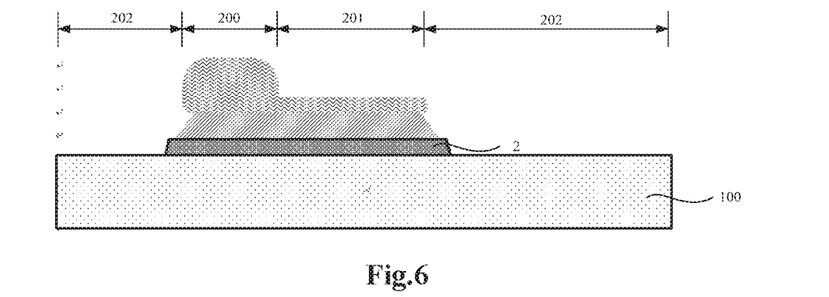
Figure 7:
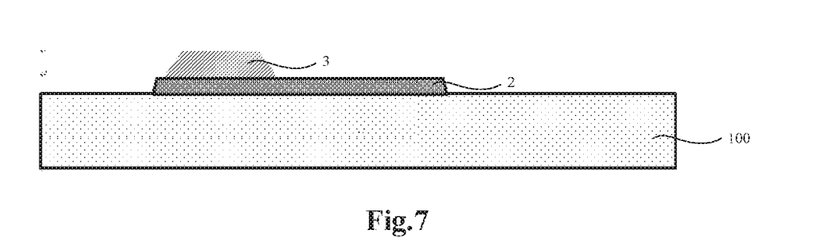

As shown in FIG. 4-FIG. 7, the patterning process of forming the source electrode 3 and the active layer 2 includes:
  forming an active layer thin film 110;
  forming a source metallic layer 120 on the active layer thin film 110, as shown in FIG. 4;

coating a photoresist onto the source metallic layer 120, exposing and developing the photoresist to form a photoresist completely-reserved region 200, a photoresist partially-reserved region 201 and a photoresist unreserved region 202; where the photoresist completely-reserved region 200 corresponds to a region where the source electrode of the thin film transistor is located, the photoresist partially-reserved region 201 corresponds to a region of the active layer where the active layer of the thin film transistor does not correspond to the source electrode, and the photoresist unreserved region 202 corresponds to other regions, as shown in FIG. 5;

etching off the source metallic layer and the active layer thin film in the photoresist unreserved region 202 to form a pattern of the active layer 2, as shown in FIG. 6;

removing the photoresist in the photoresist partially-reserved region 201;

etching off the source metallic layer in the photoresist partially-reserved region 201; and peeling off remained photoresist to form the active layer 2 and the source electrode 3 of the thin film transistor, as shown in FIG. 7.

With the above steps, the active layer 2 and the source electrode 3 are simultaneously formed through a single patterning process.

Compared with the existing top-gate co-planar structure, a width of the source electrode 3 can be effectively reduced by forming the active layer 2 and the source electrode 3 simultaneously by a single patterning process. The source electrode 3 and the drain electrode 4 are located at different layers and formed by different films. Therefore, a width of the drain electrode 4 can be increased properly (reflected by comparison between FIG. 1 and FIG. 3) in a case that a projection width of the thin film transistor is determined. In addition, there is only one layer second insulation layer 140 between a pixel electrode 5 and the drain electrode 4, and the pixel electrode 5 is in electrical contact with the drain electrode 4 via a via hole in the second insulation layer 140. Since the via hole has a small depth, the pixel electrode 5 may be prevented from being broken easily, thereby improving the yield of products.

In addition, a portion of the gate electrode may be designed at a same layer as the pixel electrode 5 of the array substrate and it is able to ensure the gate electrode is far away from the pixel electrode 5, such that a coupling capacitance therebetween is small enough and the performance of the device may not be affected.

Specifically, according to an embodiment of the present disclosure, a gate electrode of a top-gate co-planar thin film transistor includes a first portion 10 located on the second insulation layer 140. The first portion 10 includes a part corresponding to a region between the source electrode 3 and the drain electrode 4. Optionally, the first portion 10 of the gate electrode and the pixel electrode 5 of the array substrate are located at a same layer and formed by a same film. Specifically, the first portion 10 of the gate electrode and the pixel electrode 5 can be formed by forming a conductive layer on the second insulation layer 140 and then patterning the conductive layer, where the first portion 10 of the gate electrode has a part corresponding to the region between the source electrode 3 and the drain electrode 4.

Accordingly, the method may further include:

forming the second insulation layer 140 covering the drain electrode 4; and forming the gate electrode, where the gate electrode includes the first portion 10 located on the second insulation layer 140 and the first portion includes the part corresponding to the region between the source electrode 3 and the drain electrode 4, as shown in FIG. 3.

Figure 9:
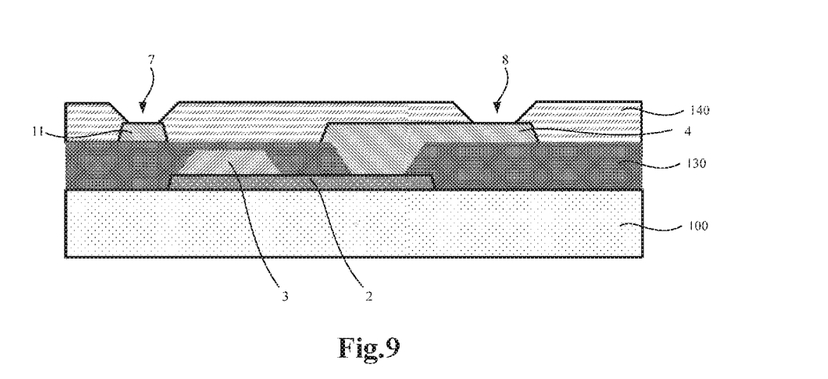

The first portion 10 of the gate electrode and the pixel electrode 5 of the array substrate are located at the same layer and formed by the same conductive layer. As shown in FIG. 3 and FIG. 9, the pixel electrode 5 is in contact with the drain electrode 4 via a third via hole 8 in the second insulation layer 140. Since there is only the second insulation layer 140 between the pixel electrode 5 and the drain electrode 4, the third via hole 8 has a small depth and the pixel electrode 5 may be prevented from being broken due to a difficulty in climbing, thereby improving the yield of products.

Further, the gate electrode may include a second portion 11, which is electrically connected with the first portion 10 of the gate electrode and made of a gate metal. In addition, signals for turning on or turning off the thin film transistor can still be transmitted to the gate electrode via a gate line (which is formed by a gate metallic layer and located at a same layer as the second portion 11 of the gate electrode) without changing the structure of wires transmitting signals. Therefore, the manufacturing process will not get complicated and is easy to be performed. The second portion 11 of the gate electrode may be arranged at a same layer and formed by a same gate metallic layer as the drain electrode 4. The second insulation layer 140 covers the second portion 11 of the gate electrode and the drain electrode 4.

In an optional implementation, the array substrate is an array substrate provided with top-gate co-planar thin film transistors. The gate electrode of each thin film transistor includes the first portion 10 and the second portion 11. The first portion 10 includes a part corresponding to a region between the source electrode 3 and the drain electrode 4 and is located at a same layer as the pixel electrode 5 of the array substrate. The second portion 11 is made of the gate metal and is located at a same layer as the drain electrode 4. The source electrode 3 is formed by the source metallic layer. The second insulation layer 140 is arranged between the first portion 10 and the second portion 11 of the gate electrode, and the first portion 10 and the second portion 11 are in contact with each other via a second via hole 7 in the second insulation layer 140.

Correspondingly, the present disclosure further provides in an embodiment a method for manufacturing an array substrate, including:

forming an active layer 2 and a source electrode 3 of a thin film transistor, where the source electrode 3 is in electrical contact with the active layer 2;

forming a first insulation layer 130 on the source electrode 3 and forming a first via hole 6 in the first insulation layer 130;

forming a gate metallic layer, patterning the gate metallic layer to form a second portion 11 of a gate electrode and a drain electrode 4, where the drain electrode 4 is in contact with the active layer 2 via the first via hole 6 in the first insulation layer 130;

forming a second insulation layer 140 covering the drain electrode 4; and forming a conductive layer on the second insulation layer 140, patterning the conductive layer to form a first portion 10 of the gate electrode and a pixel electrode 5; wherein the first portion 10 of the gate electrode includes a part corresponding to a region between the source electrode 3 and the drain electrode 4, the first portion 10 is in electrical contact with the second portion 11 via a second via hole 7 in the second insulation layer 140, and the pixel electrode 5 is in electrical contact with the drain electrode 4 via a third via hole 8 in the second insulation layer 140.

In the above steps, optionally, the active layer 2 and the source electrode 3 of the thin film transistor are formed by a single patterning process, thereby simplifying the manufacturing processes. Alternatively, the active layer 2 and the source electrode 3 can be formed through two patterning processes respectively.

For the top-gate co-planar thin film transistor, when the gate electrode includes the second portion 11 which is made of the gate metal and located at a same layer as the drain electrode 4, the second portion 11 may be optionally arranged at a side of the source electrode 3 far away from the drain electrode 4, as shown in FIG. 3. Hence, coupling capacitance between the second portion 11 and the source electrode 3 and coupling capacitance between the second portion 11 and the drain electrode 4 can be reduced, and display quality of the device can be improved.

As shown in FIG. 3, a thin film transistor according to an embodiment of the present disclosure includes:
- an active layer 2, where the whole active layer 2 is located on a plane;
- a source electrode 3 arranged on the active layer 2 and located in a region where the active layer 2 is located, where the whole source electrode 3 is in contact with the active layer 2;
- a first insulation layer 130 located on the source electrode 3 and including a first via hole;
- a second portion 11 of a gate electrode and a drain electrode 4 arranged on the first insulation layer 130; wherein the drain electrode 4 is in contact with the active layer 2 via the first via hole, the second portion 11 of the gate electrode is made of a gate metal and is located at a same layer as the drain electrode 4, and the second portion 11 is located at a side of the source electrode 3 far away from the drain electrode 4;
- a second insulation layer 140 arranged on the drain electrode 4 and including a second via hole 7 and a third via hole 8; and
- a first portion 10 of the gate electrode, where the first portion 10 is arranged on the second insulation layer 140 and is in electrical contact with the second portion 11 via the second via hole 7.

An array substrate according to an embodiment of the present disclosure includes:
- the foregoing thin film transistor;
- a second insulation layer 140 covering the drain electrode 4 of the thin film transistor; and
- a pixel electrode 5 arranged on the second insulation layer 140 and located at a same layer as the first portion 10 of the gate electrode, wherein the pixel electrode 5 is in electrical contact with the drain electrode 4 via the third via hole in the second insulation layer 140.

As shown in FIG. 3-FIG. 9, a method for manufacturing a thin film transistor according to an embodiment of the present disclosure includes steps S1-S5.

In step S1, a substrate 100, for example, a glass substrate, a quartz substrate, an organic resin substrate and other transparent substrates, is provided; and an active layer 2 and a source electrode 3 are formed on the substrate 100.

The active layer 2 may be made of silicon semiconductor or may be made of metallic oxide semiconductor. The source electrode 3 is made of metal such as Cu, Al, Ag, Mo, Cr, Nd, Mn, Ti, Ta and W or any alloy thereof. The source electrode 3 may have a single layer structure, or a multi-layer structure such as Cu/Mo, Ti/Cu/TI, Mo/Al/Mo.

Specifically, steps of forming the active layer 2 and the source electrode 3 on the substrate 100 may include:
- forming an active layer thin film 110 and a source metallic layer 120 successively on the substrate 100;
- coating a photoresist onto the source metallic layer 120, exposing and developing the photoresist to form a photoresist completely-reserved region 200, a photoresist partially-reserved region 201 and a photoresist unreserved region 202; wherein the photoresist completely-reserved region 200 corresponds to a region where the source electrode of the thin film transistor is located, the photoresist partially-reserved region 201 corresponds to a region where the active layer of the thin film transistor does not correspond to the source electrode, and the photoresist unreserved region 202 corresponds to other regions, as shown in FIG. 5;
- etching off the source metallic layer and the active layer thin film in the photoresist unreserved region 202 to form a pattern of the active layer 2, as shown in FIG. 6;
- removing the photoresist in the photoresist partially-reserved region 201;
- etching off the source metallic layer in the photoresist partially-reserved region 201; and
- peeling off remained photoresist to form the active layer 2 and the source electrode 3 of the thin film transistor.

In step S2, a first insulation layer 130 is formed on the substrate 100 processed through step S1, and the first insulation layer 130 is patterned to form a first via hole 6 through which the active layer 2 is exposed, as shown in FIG. 8.

The first insulation layer 130 may be made of SiNx, SiOx or Si(ON)x.

In step S3, as shown in FIG. 8 and FIG. 9, a gate metallic layer (not shown in the figures) is formed on the substrate processed through the step S2, and the gate metallic layer is patterned to form a second portion 11 of a gate electrode, a drain electrode 4 and a gate line. The second portion 11 of the gate electrode is electrically connected with the gate line, the drain electrode 4 is in electrical contact with the active layer 2 via the first via hole 6.

The gate metallic layer may be made of metal such as Cu, Al, Ag, Mo, Cr, Nd, Mn, Ti, Ta and W or any alloy thereof. The gate metallic layer may have a single layer structure, or a multi-layer structure such as Cu/Mo, Mo/Al/Mo.

In step S4, a second insulation layer 140 is formed on the substrate 100 processed through the step S3, and the second insulation layer 140 is patterned to form a second via hole 7 and a third via hole 9, as shown in FIG. 9.

The second insulation layer 140 may be made of SiNx, SiOx or Si(ON)x.

In step S5, a conductive layer is formed on the substrate 100 processed through step S4, and the conductive layer is patterned to form a first portion 10 of the gate electrode. The first portion 10 of the gate electrode has a part corresponding to a region between the source electrode 3 and the drain electrode 4 and is in electrical contact with the second portion 11 via the second via hole 7, as shown in FIG. 3 and FIG. 9.

The manufacturing of the thin film transistor is accomplished here.

A method for manufacturing an array substrate according to an embodiment of the present disclosure includes:

forming a thin film transistor with above steps S1-S5, and forming a pixel electrode 5 of the array substrate while forming the first portion 10 of the gate electrode in step S5; wherein the pixel electrode 5 is in electrical contact with the drain electrode 4 via the third via hole 8, as shown in FIG. 3 and FIG. 9.

Specifically, steps of forming the first portion 10 of the gate electrode and the pixel electrode 5 include:

forming a conductive layer on the substrate processed through step S4, and patterning the conductive layer to form the first portion 10 of the gate electrode and the pixel electrode 5.

A display device is further provided according to an embodiment of the present disclosure. The display device includes the foregoing array substrate which can improve the yield and display quality of the display device.

The display device may be a liquid crystal display device or an organic light emitting diode display device. Specifically, the display device may be any product or component having a display function, for example, a liquid crystal panel, an electronic paper, an OLED panel, a cellular phone, a tablet computer, a television, a display, a laptop, a digital photo frame or a navigator.

In the technical solution of the present disclosure, the source electrode and the drain electrode of the thin film transistor are arranged on the active layer and the active layer is located on a plane. Accordingly, it is able to prevent the active layer from being broken due to the difficulty in climbing. In addition, the active layer has a uniform thickness so that the short circuit may be avoided, thereby improving the yield of the thin film transistor. Furthermore, the source electrode and the drain electrode are arranged at different layers and a distance between the source electrode and the drain electrode can be adjusted flexibly, thereby facilitating achievement of a narrow channel and improving performance of the thin film transistor.

The above described are merely optional implementations of the present disclosure. It should be noted that, the ordinary skilled in the art can make various improvements and replacements without departing from the technical principle of the present disclosure. All the improvements and replacements fall within the scope of protection of the present disclosure.

What is claimed is:

1. A thin film transistor, comprising:
   an active layer located on a plane;
   a source electrode, which is located on the active layer and is in contact with the active layer;
   a first insulation layer located on the source electrode and comprising a first via hole;
   a drain electrode located on the first insulation layer, wherein the drain electrode is in contact with the active layer via the first via hole,
   a second insulation layer covering the drain electrode; and
   a gate electrode comprising a first portion, wherein the first portion is located on the second insulation layer and comprises a part corresponding to a region between the source electrode and the drain electrode,
   wherein the gate electrode further comprises a second portion electrically connected with the first portion of the gate electrode, the drain electrode and the second portion of the gate electrode are at a same layer, and the second insulation layer covers the second portion of the gate electrode and the drain electrode.

2. The thin film transistor according to claim 1, wherein the second portion of the gate electrode is located at a side of the source electrode far away from the drain electrode.

3. The thin film transistor according to claim 1, wherein the second insulation layer comprises a second via hole, and the first portion of the gate electrode is in electrical contact with the second portion of the gate electrode via the second via hole.

4. The thin film transistor according to claim 1, wherein the second portion of the gate electrode and the drain electrode are made of a gate metal.

5. The thin film transistor according to claim 1, wherein the first portion of the gate electrode is made of a transparent conductive material.

6. The thin film transistor according to claim 1, wherein the source electrode is located in a region where the active layer of the thin film transistor is located and the entire source electrode is in contact with the active layer.

7. A manufacturing method for a thin film transistor, comprising:
   forming an active layer, wherein the entire active layer is located on a plane;
   forming a source electrode on the active layer, the source electrode being in contact with the active layer;
   forming a first insulation layer on the source electrode and forming a first via hole in the first insulation layer;
   forming a drain electrode on the first insulation layer, wherein the drain electrode is in contact with the active layer via the first via hole,
   forming a second insulation layer covering the drain electrode;
   forming a gate electrode, wherein the gate electrode comprises a first portion located on the second insulation layer and the first portion comprises a part corresponding to a region between the source electrode and the drain electrode, and
   forming a second via hole in the second insulation layer;
   wherein steps of forming the gate electrode and the drain electrode comprise:
   forming a gate metallic layer on the first insulation layer, patterning the gate metallic layer to form a second portion of the gate electrode and the drain electrode, wherein the drain electrode is in contact with the active layer via the first via hole in the first insulation layer; and
   forming a conductive layer on the second insulation layer, patterning the conductive layer to form the first portion of the gate electrode, wherein the first portion of the gate electrode comprises the part corresponding to the region between the source electrode and the drain electrode, and the first portion of the gate electrode is in electrical contact with the second portion of the gate electrode via the second via hole in the second insulation layer.

8. The manufacturing method according to claim 7, wherein steps of forming the active layer and the source electrode comprise:
   forming an active layer thin film;
   forming a source metallic layer on the active layer thin film;
   coating a photoresist onto the source metallic layer, exposing and developing the photoresist to form a photoresist completely-reserved region, a photoresist partially-reserved region and a photoresist unreserved region; wherein the photoresist completely-reserved region corresponds to a region where the source electrode of the thin film transistor is located; the photoresist partially-reserved region corresponds to a region of the active layer where the active layer of the thin film transistor does not correspond to the source electrode; and the photoresist unreserved region corresponds to other regions;

etching off the source metallic layer and the active layer thin film in the photoresist unreserved region, to form a pattern of the active layer;

removing the photoresist in the photoresist partially-reserved region;

etching off the source metallic layer in the photoresist partially-reserved region; and peeling off remained photoresist to form the active layer and the source electrode of the thin film transistor.

9. An array substrate, comprising:
the thin film transistor according to claim 1;
a second insulation layer covering the drain electrode of the thin film transistor and comprising a third via hole; and
a pixel electrode located on the second insulation layer, wherein the pixel electrode is in electrical contact with the drain electrode of the thin film transistor via the third via hole.

10. A display device, comprising the array substrate according to claim 9.

11. A manufacturing method for an array substrate, comprising:
forming an active layer, wherein the entire active layer is located on a plane;
forming a source electrode on the active layer, the source electrode being in contact with the active layer;
forming a first insulation layer on the source electrode and forming a first via hole in the first insulation layer;
forming a gate metallic layer on the first insulation layer, patterning the gate metallic layer to form a second portion of a gate electrode and a drain electrode, wherein the drain electrode is in contact with the active layer via the first via hole in the first insulation layer;
forming a second insulation layer covering the drain electrode and forming a second via hole and a third via hole in the second insulation layer;
forming a first portion of the gate electrode on the second insulation layer, wherein the first portion comprises a part corresponding to a region between the source electrode and the drain electrode, and the first portion of the gate electrode is in electrical contact with the second portion of the gate electrode via the second via hole in the second insulation layer; and
forming a pixel electrode of the array substrate while forming the first portion of the gate electrode, wherein the pixel electrode is in electrical contact with the drain electrode via the third via hole.

12. The manufacturing method according to claim 11, wherein steps of forming the first portion of the gate electrode and the pixel electrode comprise:
forming a conductive layer on the second insulation layer, patterning the conductive layer to form the first portion of the gate electrode and the pixel electrode.

13. The thin film transistor according to claim 2, wherein the source electrode is located in a region where the active layer of the thin film transistor is located and the entire source electrode is in contact with the active layer.

* * * * *